United States Patent
Yamamoto et al.

(10) Patent No.: US 12,206,057 B2
(45) Date of Patent: Jan. 21, 2025

(54) JOINT BODY AND LIGHT SOURCE DEVICE

(71) Applicant: KYOCERA Corporation, Kyoto (JP)

(72) Inventors: Sentarou Yamamoto, Kagoshima (JP); Youji Furukubo, Kirishima (JP); Kazuhiro Okamoto, Kirishima (JP); Yuhei Matsumoto, Kirishima (JP); Kouichirou Sugai, Kirishima (JP); Kazuki Nishimoto, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 567 days.

(21) Appl. No.: 17/435,296

(22) PCT Filed: Mar. 5, 2020

(86) PCT No.: PCT/JP2020/009381
§ 371 (c)(1),
(2) Date: Aug. 31, 2021

(87) PCT Pub. No.: WO2020/184371
PCT Pub. Date: Sep. 17, 2020

(65) Prior Publication Data
US 2022/0158053 A1    May 19, 2022

(30) Foreign Application Priority Data
Mar. 8, 2019 (JP) ................ 2019-042507

(51) Int. Cl.
*H01L 33/62* (2010.01)
(52) U.S. Cl.
CPC .................. *H01L 33/62* (2013.01)
(58) Field of Classification Search
CPC ........ H01L 24/24; H01L 24/19; H01L 24/20; H01L 21/4857; H01L 21/561; H01L 21/565; H01L 21/6835; H01L 21/568; H01L 2221/68345; H01L 2221/68359; H01L 2221/68372; H01L 23/3128; H01L 23/5383; H01L 23/5386; H01L 23/5382; H01L 2224/24137; H01L 2224/04105;
(Continued)

(56) References Cited

U.S. PATENT DOCUMENTS

| | | | |
|---|---|---|---|
| 2015/0060930 A1* | 3/2015 | Sasaki | H01L 33/642 257/99 |
| 2016/0035660 A1* | 2/2016 | Terasaki | H01L 23/49838 174/257 |
| 2017/0271238 A1* | 9/2017 | Terasaki | H01L 23/49811 |

FOREIGN PATENT DOCUMENTS

| | | |
|---|---|---|
| JP | 2006-066716 A | 3/2006 |
| WO | 2017/188237 A1 | 11/2017 |

* cited by examiner

*Primary Examiner* — Kyoung Lee
*Assistant Examiner* — Christina A Sylvia
(74) *Attorney, Agent, or Firm* — Volpe Koenig

(57) ABSTRACT

A joint body of the present disclosure includes a substrate including a base member having insulating properties and a metal layer positioned on a first main surface of the base member, a metal joint layer, and a metal member. The metal joint layer is positioned between the metal layer and the metal member of the substrate. The metal joint layer includes a nickel layer, a solder layer, and a composite layer containing a mix of nickel and solder. The nickel layer, the composite layer, and the solder layer are positioned in this order from the metal layer side to the metal member side. The nickel in the composite layer extends from the nickel layer in the thickness direction and forms protrusions and recesses.

14 Claims, 11 Drawing Sheets

(58) Field of Classification Search
CPC ........... H01L 2224/12105; H01L 22/34; H01L 2223/6638; H01L 2924/18162
See application file for complete search history.

DISTRIBUTION OF Cu IN METAL LAYER

COMPOSITE LAYER THICKNESS

JOINT BODY AND LIGHT SOURCE DEVICE

TECHNICAL FIELD

The present disclosure relates to a joint body and a light source device.

BACKGROUND ART

In recent years, light emitting diodes (LEDs) have been used in headlights of automobiles. Light source devices that use LEDs are required to have high heat dissipation. In a light source device that uses LEDs, a joint body formed by joining an aluminum metal member (heat dissipating member) to a ceramic substrate is used as a wiring board (see, for example, Patent Document 1).

CITATION LIST

Patent Literature

Patent Document 1: WO 2017/188237

SUMMARY

A joint body of the present disclosure includes a substrate including a base member having insulating properties and a metal layer positioned on a first main surface of the base member, a metal joint layer, and a metal member. The metal joint layer is positioned between the metal layer and the metal member of the substrate. The metal joint layer includes a nickel layer, a solder layer, and a composite layer containing a mix of nickel and solder. The nickel layer, the composite layer, and the solder layer are positioned in this order from the metal layer side to the metal member side. The nickel in the composite layer extends from the nickel layer in the thickness direction and forms protrusions and recesses.

A light source device of the present disclosure includes the above-mentioned joint body and a light emitting element provided on the substrate of the joint body.

DESCRIPTION OF EMBODIMENTS

The joint body disclosed in Patent Document 1 is formed by joining a ceramic substrate and an aluminum metal member (heat dissipating member) by using a metal joint layer such as solder. Furthermore, in recent years, such a joint body has been required to have higher durability. In light of this, an object of the present disclosure is to provide a joint body capable of suppressing degradation in bonding strength between a substrate and a heat dissipating member.

A joint body of an embodiment will be described below with reference to FIGS. 1 to 10. Note that an aspect of the present invention is not limited to the particular embodiment described below. The aspect of the present invention includes various aspects insofar as these aspects fall within the spirit or scope of the general concepts of the invention as defined by the appended claims.

Figure 1:
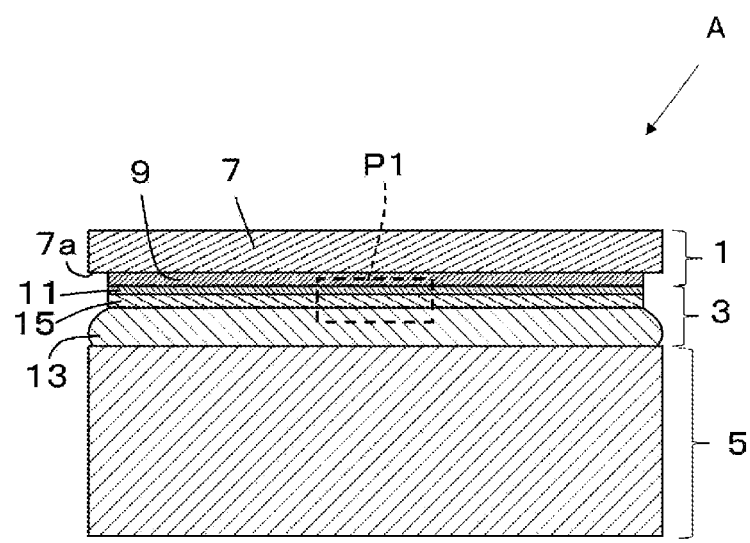
FIG. 1 is a cross-sectional view of a joint body as an example of an embodiment.
Figure 2:
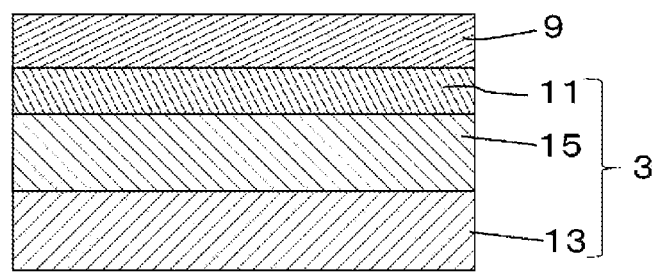
FIG. 2 is an enlarged view of a portion P1 in FIG. 1.
Figure 3:
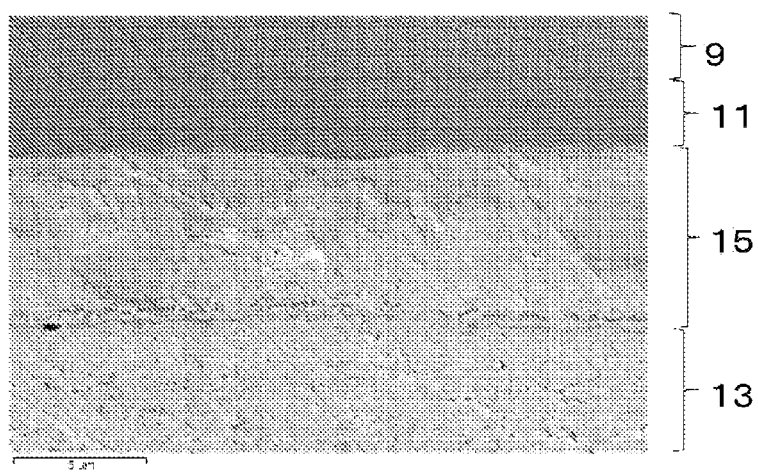
FIG. 3 is a scanning electron microscopy image of a portion corresponding to the portion P1 of the joint body illustrated in FIG. 2.
Figure 4:
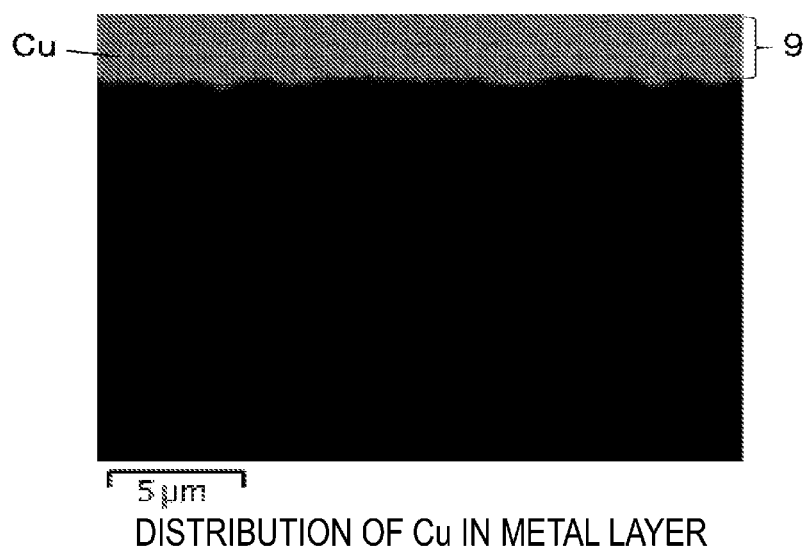
FIG. 4 is an element (Cu) mapping photograph of the portion in FIG. 3.
Figure 5:
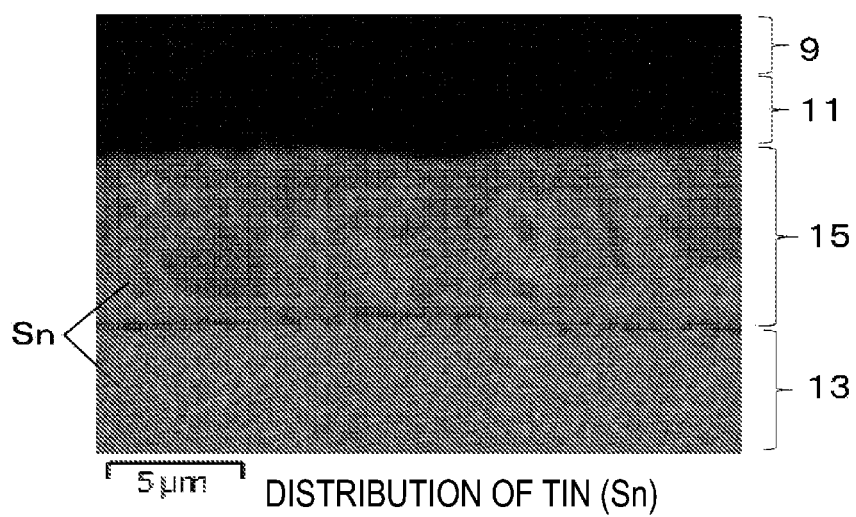
FIG. 5 is an element (Sn) mapping photograph of the portion in FIG. 3.
Figure 6:
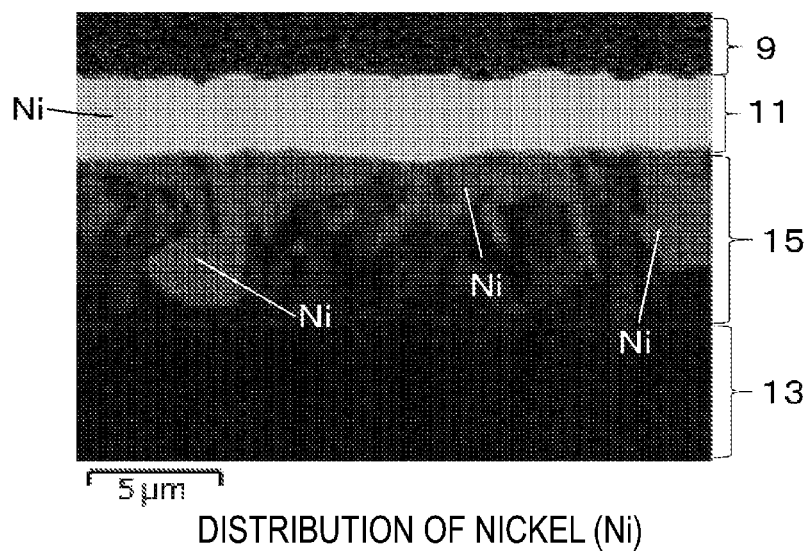
FIG. 6 is an element (Ni) mapping photograph of the portion in FIG. 3.
Figure 7:
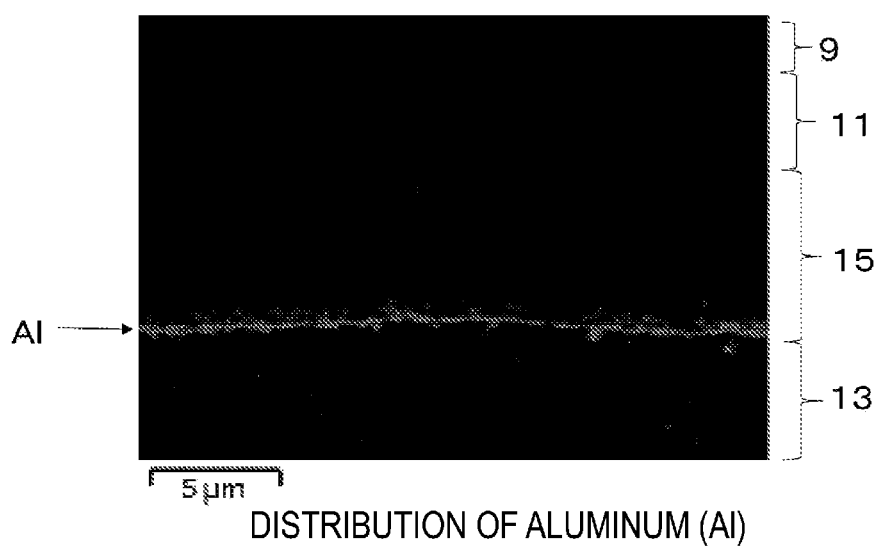
FIG. 7 is an element (Al) mapping photograph of the portion in FIG. 3.
Figure 8:
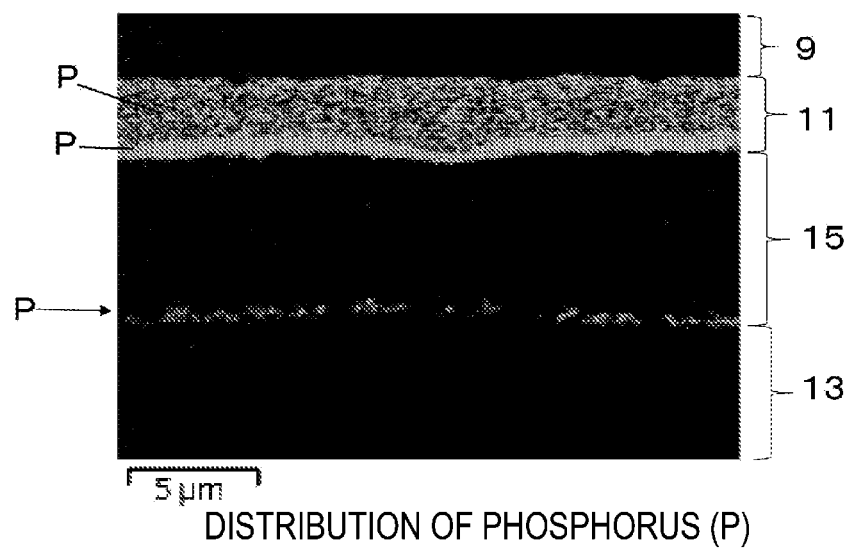
FIG. 8 is an element (P) mapping photograph of the portion in FIG. 3.
Figure 9:
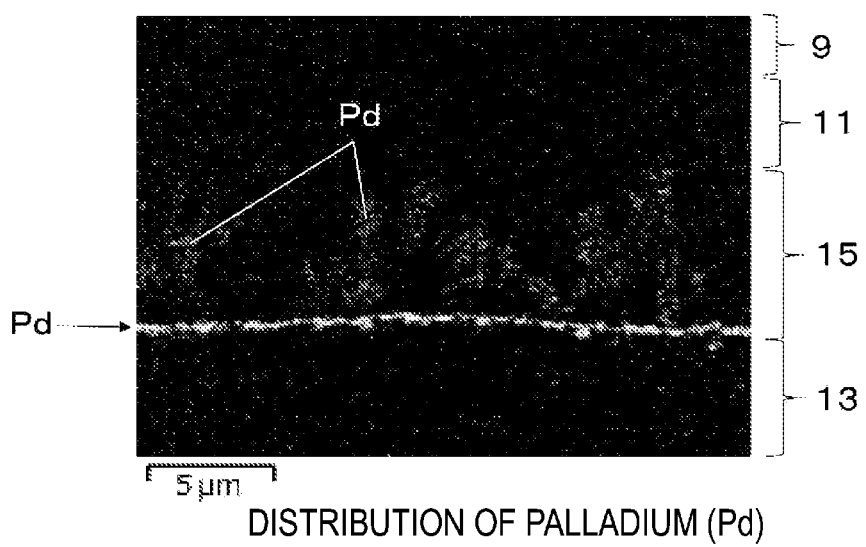
FIG. 9 is an element (Pd) mapping photograph of the portion in FIG. 3.

FIG. 1 is a cross-sectional view of a joint body as an example of an embodiment. FIG. 2 is an enlarged view of a portion P1 in FIG. 1. FIG. 3 is a scanning electron microscopy image of a portion corresponding to the portion P1 of the joint body illustrated in FIG. 2. FIG. 4 is an element (Cu) mapping photograph of the portion in FIG. 3. FIG. 5 is an element (Sn) mapping photograph of the portion in FIG. 3. FIG. 6 is an element (Ni) mapping photograph of the portion in FIG. 3. FIG. 7 is an element (Al) mapping photograph of the portion in FIG. 3. FIG. 8 is an element (P) mapping photograph of the portion in FIG. 3. FIG. 9 is an element (Pd) mapping photograph of the portion in FIG. 3. The element mapping photographs shown in FIGS. 4 to 9 were obtained by using an energy dispersive X-ray spectroscopy (EDS) analyzer attached to a scanning electron microscope.

A joint body A, which is an example of an embodiment, includes a substrate 1, a metal joint layer 3, and a metal member 5. The metal joint layer 3 is positioned between the substrate 1 and the metal member 5. The substrate 1 includes a base member 7 having insulating properties. The substrate 1 includes a metal layer 9 provided on one main surface 7a of the base member 7. The base member 7 and the metal layer 9 are joined together. Herein, the main surface 7a may also be referred to as a first main surface 7a.

The metal joint layer 3 includes a nickel layer 11, a solder layer 13, and a composite layer 15. The composite layer 15 is in a state where nickel and solder are mixed. In the joint body A, the nickel layer 11, the composite layer 15, and the solder layer 13 are positioned in this order from the metal layer 9 side to the metal member 5 side of the base member 7. In the composite layer 15, the nickel extends from the nickel layer 11 in the thickness direction and forms protrusions and recesses. The joint body A satisfying this configuration achieves excellent joining properties between the substrate 1 and the metal member 5.

In this case, the composite layer 15 may be provided to cover the entire surface of the nickel layer 11 formed on the surface of the metal layer 9. Furthermore, the solder layer 13 may include lead (Pb), but in consideration of the environment, the solder layer 13 may include tin (Sn) as a main component without including lead, as illustrated in FIG. 5.

As described above, the joint body A has a portion in which nickel and solder are mixed in the composite layer 15. As is also evident from the element mapping photograph of nickel shown in FIG. 6, the concentration of nickel contained in the composite layer 15 is lower than the concentration of nickel in the nickel layer 11. In this case, the difference in the concentration of nickel can be confirmed from the color gradation in the element mapping photograph.

The nickel contained in the composite layer 15 may be included in a particulate state. In this case, the particulate state of the nickel contained in the composite layer 15 is based on determination from the element mapping photograph. That is, in the element mapping photograph, the element (nickel) appears to be present as dots. More specifically, in the composite layer 15, solder (Sn in this case) is present in gaps between the fine particles of nickel. In other words, in the composite layer 15, fine particles of the nickel and fine particles of the solder (Sn) are mixed. As a result, the composite layer 15 positioned between the nickel layer 11 and the solder layer 13 has excellent mechanical strength.

As illustrated in FIG. 7, the metal joint layer 3 constituting the joint body A further includes aluminum. This aluminum may be distributed in the form of a layer between the composite layer 15 and the solder layer 13. The joint body A may further contain a metal component of at least one of phosphorus and palladium (see FIGS. 8 and 9). At least one of phosphorus and palladium is preferably included at the position of the aluminum at a higher concentration than in other regions of the composite layer 15.

In this embodiment, the aluminum is distributed in a row on the lower side (solder layer 13 side) of the composite layer 15. When the aluminum is distributed in the form of a layer in a row on the lower side (solder layer 13 side) of the composite layer 15, the bonding strength between the composite layer 15 and the solder layer 13 increases, which in turn increases the bonding strength of the joint body A. As a result, the joint body A that satisfies such a configuration has excellent thermal shock resistance between room temperature (25° C.) and high temperature environments. Here, "high temperature" refers to a temperature at or above the melting temperature of the solder (250° C. or higher).

Figure 10:
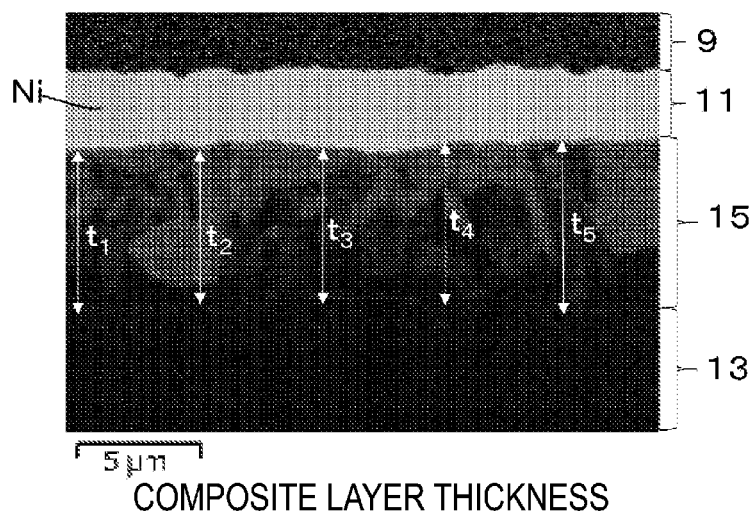
FIG. 10 is a schematic diagram illustrating a method for measuring the thickness of a composite layer from an element mapping photograph.

The thickness (average thickness) of the composite layer 15 is, for example, not less than 1 μm and not greater than 10 μm, and more particularly may be not less than 3 μm and not greater than 6 μm. The average width of the composite layer 15 is determined by the following method, for example. FIG. 10 is a schematic diagram illustrating a method for measuring the thickness of the composite layer 15 from an element mapping photograph. First, an element mapping photograph of nickel such as that shown in FIG. 6 is prepared. Next, in the region of the composite layer 15 in the photograph, the thickness of the portion where nickel is present and forms protrusions and recesses is found for a plurality of locations. Here, the state in which nickel is present in the composite layer 15 and forms protrusions and recesses refers to a region indicating the intensity of a characteristic X-ray of 20% or greater when the intensity of the characteristic X-ray of nickel in the nickel layer 11 is 100% when performing EDS analysis. In EDS analysis, the intensity of the characteristic X-ray is apparent due to the difference in color. Next, the average value of the thickness is determined from thicknesses t1, t2, t5 of the composite layer 15 at each location. In FIG. 10, measurements are taken at approximately 5 μm intervals. In FIG. 10, the thickness of the composite layer 15 at each location is indicated by the reference numerals t1, t2, t5. The average thickness of the composite layer 15 may be determined from performing measurement as described above at a plurality of locations and using the average value of these measurements.

In the present disclosure, a layer of the aluminum distributed in the form of a layer between the composite layer 15 and the solder layer 13 refers to a portion having a thickness of 0.1 μm or greater and in which the aluminum is confirmed to be present as a layer in the mapping photograph as shown in FIG. 7. The upper limit value of the thickness of the aluminum layer is, for example, 1.5 μm. Note that the layer of aluminum between the solder layer 13 and the composite layer 15 is not limited to a continuous layer and may be partially interposed by another component such as solder, as shown in FIG. 7.

In this embodiment, the base member 7 has high insulating properties, and a ceramic is used as the material of the base member 7 owing to its high mechanical strength. Specific examples of the ceramic include silicon nitride, aluminum nitride, and alumina. When using such ceramics, the thermal expansion coefficient is preferably from $3 \times 10^{-6}$/K to $8 \times 10^{-6}$/K because such a range is close to the thermal expansion coefficient of a light emitting element formed of a semiconductor material. The material of the metal layer 9 formed on the base member 7 preferably includes a base metal as a main component. For example, the material of the metal layer 9 is preferably copper (Cu), nickel (Ni), or the like. Of these, the material of the metal layer 9 is preferably copper (Cu) from the perspective of high thermal conductivity and electrical conductivity. The metal member 5 serves as a heat dissipating member. The material of the metal member 5 is preferably aluminum or an alloy with aluminum as the main component. The material of the metal member 5 may be a material with copper as the main component, which has excellent thermal conductivity, but is preferably a material having aluminum as the main component from the perspective of corrosion resistance. Preferably, the solder has tin (Sn) as a main component and includes Bi, Cu, Ni, and Ge.

Figure 11:
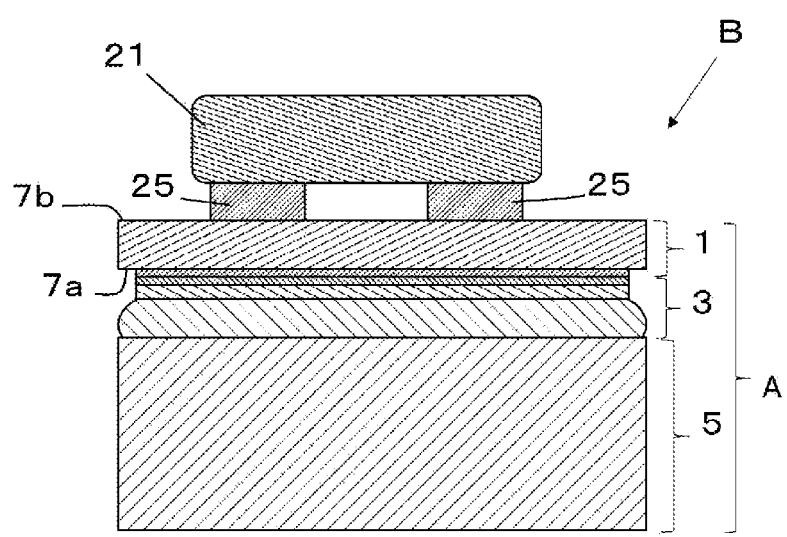
FIG. 11 is a cross-sectional view of a light source device as an example of an embodiment.

The above-described joint body A is useful as, for example, a wiring board constituting a light source device for an LED. FIG. 11 is a cross-sectional view of a light source device as an example of an embodiment. A light source device B includes the joint body A and a light emitting element 21. The light emitting element 21 is mounted on the substrate 1 that constitutes the joint body A. In this case, the substrate 1 includes a conductor 25 on a second main surface 7b of the substrate 7. The light emitting element 21 is connected to the conductor 25. As a material of the conductor 25, a metallization layer of copper having a surface including at least one type of metal selected from among nickel, gold, tin, and the like is taken as an example. In the light source device B, since the joint body A is used as a wiring board, the joining properties between the substrate 1 and the metal member 5 are good. Thus, it is possible to obtain a highly durable light source device B.

Next, the joint body A and the light source device B were actually produced and evaluated. First, the substrate 1 was prepared. The substrate 1 included the metal layer 9 on the first main surface 7a of the base member 7. A silicon nitride ceramic was used for the base member 7. A material in which copper was formed as a metallization layer was used for the metal layer 9. In this case, the nickel layer 11 was formed on the metal layer 9 by electrolytic plating. A phosphoric acid-based nickel plating solution was used to form the nickel layer 11. In addition, when forming the nickel layer 11, activation with palladium was performed. Thereafter, a gold plating film and a tin plating film were formed on the surface of the nickel layer 11 in this order. The substrate 1 was thus produced.

The metal member 5 was also prepared. The solder layer 13 was formed on one surface of the metal member 5 by ultrasonic soldering. The solder layer 13 had tin (Sn) as a main component and also included Bi, Cu, Ni, and Ge.

Next, the substrate 1 and the metal member 5 were joined together. The tin plating film formed on the substrate 1 and the solder layer 13 formed on the metal member 5 were joined by being pressed together. This joining involved placing the metal member 5 on a hot plate and overlaying the substrate 1 from the upper side of the metal member 5. At this time, a temperature gradient condition was imposed in which, between the substrate 1 and the metal member 5, the temperature increased closer to the metal member 5 and decreased closer to the substrate 1. The set temperature of the hot plate was 260° C. Thus, the metal joint layer 3 having the structure illustrated in FIGS. 1 to 9 was formed on the joint body A obtained as described above. In other words, in the joint body A, the metal joint layer 3 was present between the substrate 1 and the metal member 5. The metal joint layer 3 included the composite layer 15 containing a mix of nickel and solder between the nickel layer 11 and the solder layer 13. Further, aluminum being a component of the metal member 5 was diffused into the metal joint layer 3 and distributed in the form of a layer. The portion in which aluminum was present in the form of a layer also contained phosphorus and palladium at higher concentrations than in other regions. Using the joint body A obtained as described above as the substrate in a light source device afforded a light source device that was able to withstand long term (continuous 10,000 hours) driving.

REFERENCE SIGNS LIST

A Joint body
B Light source device
1 Substrate
3 Metal joint layer
5 Metal member
7 Substrate
9 Metal layer
11 Nickel layer
13 Solder layer
15 Composite layer
21 Light emitting element
25 Conductor

The invention claimed is:

1. A joint body comprising:
a substrate comprising a base member having insulating properties, and a metal layer positioned on a first main surface of the base member;
a metal joint layer; and
a metal member, wherein
the metal joint layer is positioned between the metal layer of the substrate and the metal member, and comprises a nickel layer, a solder layer, and a composite layer containing a mix of nickel and solder, the nickel layer, the composite layer, and the solder layer are positioned in this order from a metal layer side of the substrate to a metal member side of the metal member,
the nickel in the composite layer extends from the nickel layer in a thickness direction and forms protrusions and recesses, and
the metal joint layer further comprises aluminum, the aluminum being distributed in a form of a layer between the composite layer and the solder layer.

2. The joint body according to claim 1, wherein
the metal joint layer further comprises phosphorous, and the phosphorous is included at a position of the aluminum distributed in the form of the layer.

3. The joint body according to claim 2, wherein
the phosphorous included at the position of the aluminum is at a higher concentration than a concentration in other regions of the composite layer.

4. The joint body according to claim 1, wherein
the metal joint layer further comprises palladium, and the palladium is included at a position of the aluminum distributed in the form of the layer.

5. The joint body according to claim 4, wherein
the palladium included at the position of the aluminum is at a higher concentration than a concentration in other regions of the composite layer.

6. The joint body of claim 1, wherein the composite layer further comprises aluminum distributed as an aluminum layer in a lower side of the composite layer adjacent the solder layer.

7. The joint body of claim 6, wherein the aluminum layer is partially interposed with the solder.

8. The joint body of claim 1, wherein at least one of phosphorus and/or palladium is included at a position of the aluminum at a higher concentration than a concentration in other regions of the composite layer.

9. The joint body of claim 1, wherein the nickel contained in the composite layer is in a particulate state, and solder is present in gaps between fine particles of nickel.

10. A light source device comprising:
the joint body according to claim 1; and
a light emitting element provided on the substrate of the joint body.

11. A joint body comprising:
a substrate comprising a base member and a metal layer;
a metal member, and
a metal joint layer positioned between the substrate and the metal member, the metal joint layer comprising:
a nickel layer adjacent the metal layer,
a solder layer, and
a composite layer positioned between the nickel layer and the solder layer, the composite layer including nickel and solder, wherein the nickel extends from the nickel layer in a thickness direction, and the nickel forms protrusions and recesses.

12. The joint body of claim 11, wherein an average thickness of the composite layer is not less than 1 μm and not greater than 10 μm.

13. The joint body of claim 11, wherein an average thickness of the composite layer is not less than 3 μm and not greater than 6 μm.

14. The joint body of claim 11, wherein a region of the nickel that forms protrusions and recesses in the composite layer has an intensity of a characteristic X-ray of 20% or greater when an intensity of the characteristic X-ray of nickel in the nickel layer is 100%.

* * * * *